United States Patent
Haug

(10) Patent No.: US 10,862,178 B2
(45) Date of Patent: Dec. 8, 2020

(54) LENGTH EXPANSION MONITORING FOR DETERMINING THE AGING OF A BATTERY CELL OR A BATTERY MODULE

(71) Applicant: Robert Bosch GmbH, Stuttgart (DE)

(72) Inventor: Karsten Haug, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 906 days.

(21) Appl. No.: 15/488,993

(22) Filed: Apr. 17, 2017

(65) Prior Publication Data

US 2017/0309973 A1   Oct. 26, 2017

(30) Foreign Application Priority Data

Apr. 20, 2016   (DE) .................. 10 2016 206 671

(51) Int. Cl.
| | |
|---|---|
| H01M 10/48 | (2006.01) |
| G01R 31/392 | (2019.01) |
| G01B 11/16 | (2006.01) |
| H01M 10/42 | (2006.01) |
| H01M 2/10 | (2006.01) |
| G01B 7/24 | (2006.01) |
| G01B 7/16 | (2006.01) |
| H01M 10/0525 | (2010.01) |

(52) U.S. Cl.
CPC .......... *H01M 10/482* (2013.01); *G01B 7/18* (2013.01); *G01B 7/24* (2013.01); *G01B 11/161* (2013.01); *G01R 31/392* (2019.01); *H01M 2/1022* (2013.01); *H01M 2/1077* (2013.01); *H01M 10/0525* (2013.01); *H01M 10/488* (2013.01); *H01M 2010/4271* (2013.01)

(58) Field of Classification Search
CPC ............ H01M 10/482; H01M 2/1022; H01M 2/1077; H01M 10/0525; H01M 10/488; G01R 31/392; G01B 7/18; G01B 7/24; G01B 11/161

See application file for complete search history.

(56) References Cited

U.S. PATENT DOCUMENTS

2015/0132621 A1   5/2015   Henrici et al.

FOREIGN PATENT DOCUMENTS

| DE | 102009025373 | 12/2010 | |
|---|---|---|---|
| DE | WO2011072989 | * 6/2011 | ............ H01M 6/50 |
| DE | 102012207999 | 11/2013 | |
| DE | 102012208509 | 11/2013 | |
| DE | 102012213697 | 2/2014 | |

\* cited by examiner

*Primary Examiner* — Helen Oi K Conley
(74) *Attorney, Agent, or Firm* — Michael Best & Friedrich LLP

(57) ABSTRACT

An apparatus (1) for determining the aging of a battery cell (2), the battery cell (2) having at least one galvanic element (3) for converting chemical energy into electrical energy and a housing (4) which surrounds the galvanic element (3) and has a wall (8) formed at least on one side of the galvanic element (3), comprising at least one length sensor (5) for sensing a length change of the galvanic element (3), the aging of the battery cell (2) being able to be determined via the length change of the galvanic element (3).

21 Claims, 2 Drawing Sheets

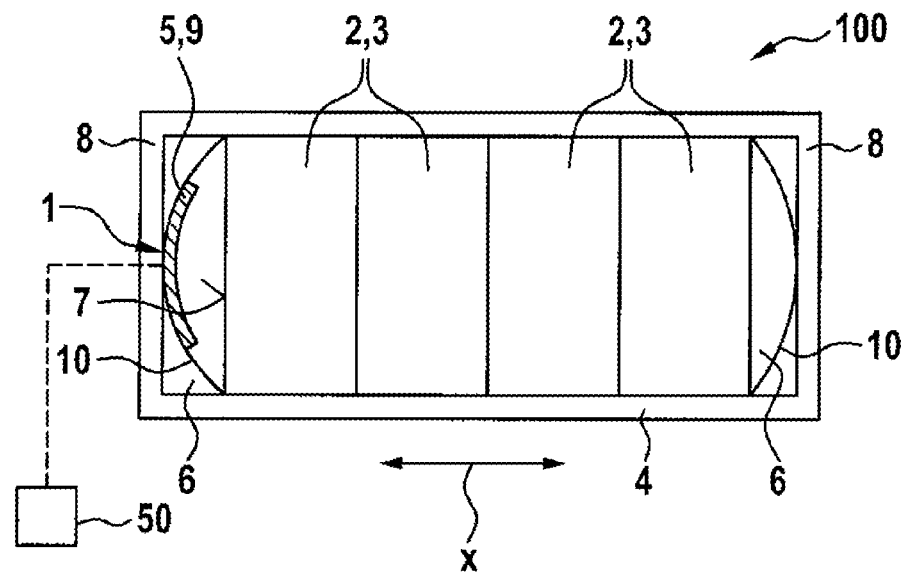
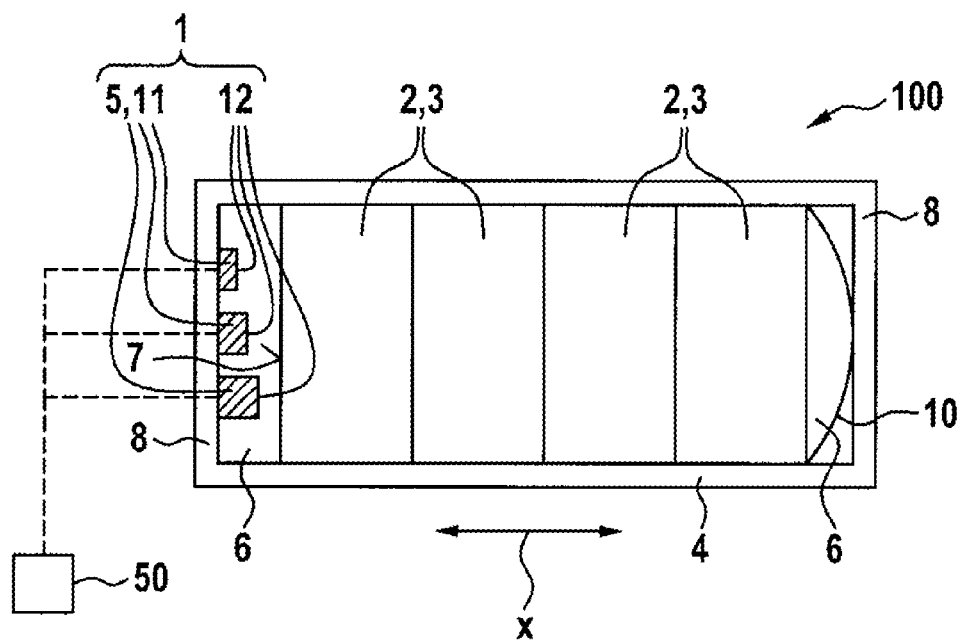

LENGTH EXPANSION MONITORING FOR DETERMINING THE AGING OF A BATTERY CELL OR A BATTERY MODULE

BACKGROUND OF THE INVENTION

The invention relates to an apparatus for determining the aging of a battery cell, to a battery cell having the apparatus according to the invention, to a battery cell module having at least two battery cells according to the invention, and to a method for monitoring the length change of a galvanic element of a battery cell, in particular of the battery cell according to the invention.

The thickness of battery cells, for example Li ion cells, typically swells with increasing aging. This property of the battery cells can be attributed both to the formation of gas and to an increase in the electrode thickness, in particular on the anode side here, with increasing time. If Li plating additionally occurs, the thickness of the battery cell can increase again. The cell thickness, that is to say the expansion of the battery cell, can therefore be considered as an indicator of the aging status of the battery cell. However, it was previously not known that the expansion of a battery cell, that is to say the cell thickness, is recorded as information, which is why this is currently not available as an aging diagnosis for a battery management system (BMS). In particular, severe increases in thickness which indicate rapidly advancing aging of the battery cell can be currently effected only indirectly by estimating the capacitance of the battery cell.

SUMMARY OF THE INVENTION

The invention proposes an apparatus, in particular a battery aging detection apparatus, for determining the thickness expansion and therefore the aging of a battery cell, the battery cell having at least one galvanic element for converting chemical energy into electrical energy and a housing which at least partially surrounds the galvanic element and has a wall formed at least on one side of the galvanic element. In this case, the apparatus comprises at least one length sensor for sensing a length change of the galvanic element, the aging of the battery cell being able to be determined via the length change of the galvanic element. This makes it possible to quickly and reliably determine aging of the battery cell.

The present invention also proposes a battery cell having at least one galvanic element for converting chemical energy into electrical energy, the battery cell being able to comprise an apparatus according to the invention.

The present invention also proposes a battery cell module for providing electrical energy, having at least two battery cells, a battery cell according to the invention being included, in particular, in the battery cell module.

Finally, the present invention proposes a method for monitoring a length change of a galvanic element of a battery cell, in particular of a battery cell according to the invention, or of a galvanic element of at least one battery cell in a battery cell module, in particular in a battery cell module (BMS) according to the invention. A table containing the expansion of the cell stack on the basis of the SOC (state of charge), temperature and possibly further operating parameters is advantageously stored in the memory of the BMS. These parameters are advantageously used to correct the length expansion, that is to say to reduce it to the pure aging influence.

Further features and details of the invention emerge from the claims, the description and the drawings. In this case, features and details described in connection with the apparatus according to the invention obviously also apply in connection with the battery cell according to the invention, the battery cell module according to the invention or else superordinate battery packs and the method according to the invention and vice versa in each case, with the result that reference is always reciprocally made or can be made with respect to the disclosure of the individual aspects of the invention.

The apparatus according to the invention for determining the aging of a battery cell, the battery cell having at least one galvanic element for converting chemical energy into electrical energy and a housing which surrounds the galvanic element and has a wall formed at least on one side of the galvanic element, comprises at least one length sensor for sensing a length change of the galvanic element, the aging of the battery cell being able to be determined via the length change of the galvanic element.

The apparatus according to the invention which provides a length sensor in a battery cell, advantageously inside a housing surrounding the galvanic element of the battery cell, can be used to measure the length expansion, that is to say the increasing electrode thickness, which occurs with aging of the battery cell. The length change of the galvanic element, in particular the change in the electrode thickness, sensed via the length sensor can be advantageously forwarded to a battery management system which converts the measured values measured during the sensing into a direct determination of the aging of the battery cell, for example on the basis of reference values. In addition, critical aging far higher than average caused by Li plating, for example, can be advantageously directly captured by sensing the length change of the galvanic element, that is to say the increase in the electrode thickness, on the basis of reference values stored in the battery management system.

In this respect, the apparatus according to the invention can be used in all battery cells or battery modules to determine the aging of the battery cells or the battery modules in which the cells, in particular the galvanic elements, significantly expand (geometrically) on account of aging. Accordingly, the apparatus according to the invention can be used, for example, for prismatic hard case cells or else for pouch cells, for example, or other (battery) cells with significant expansion caused by aging.

In contrast with the known estimation of the capacitance in the event of very thick Li plating, the apparatus according to the invention can also be used to directly capture advancing, possibly also creeping, aging through an increase in the electrode thickness, that is to say through a length change of the galvanic element, using the length sensor.

The length sensor may be arranged, for example, in a clearance between the galvanic element and the housing surrounding the galvanic element, the clearance being formed, in particular, between at least one end face of the galvanic element and the wall of the housing surrounding the galvanic element. In order to make it possible for a battery cell, that is to say in particular the galvanic element of the battery cell, to expand, which is also required, in particular, as a result of the different length expansion in different states of charge of the battery cells, a clearance is made between one side, via which the length expansion or the increase in the electrode thickness is assumed, and a housing surrounding the galvanic element in order to allow the increase in the electrode thickness or the change in the length expansion in the housing. A clearance is therefore respectively advantageously formed between at least one end face of the galvanic element, in particular between both end faces of the galvanic element, and the housing surrounding the galvanic element. This is advantageous in so far as the length expansion of the galvanic element can be effected on both sides beyond the end faces. In order to measure the length expansion or the increase in the electrode thickness, a length sensor is arranged, according to the invention, at least in one of the clearances and can be used to measure the length change of the galvanic element inside the housing surrounding the galvanic element. The advantageous arrangement of only one length sensor in only one clearance is preferably effected in cost-sensitive systems. However, acceptable measured values can already be expected using only one length sensor in the case of approximately symmetrical galvanic elements or battery modules. However, the arrangement of at least one length sensor in one clearance in each case is a particularly advantageous embodiment variant of the apparatus according to the invention. This is because, irrespective of whether the increase in the length, that is to say the increase in the electrode thickness, takes place symmetrically over both end faces of the galvanic element, the respective increase in the length, that is to say the electrode thickness, of the galvanic element can be measured using the length sensors respectively arranged in the clearances.

Since, in the case of the described arrangement of the length sensor in a battery cell, the sensor must be guided from a sealed housing outside the cell into the chemical environment of the cell, the sensor may be influenced or destroyed, on the one hand, by the chemical environment. On the other hand, this arrangement of the sensor reduces the clearance of the battery cell, thus having a negative effect on the volumetric energy density of the battery cell. Therefore, the length sensor is preferably integrated at the edge of a module comprising a plurality of cells since the measuring space of the sensor is distributed among a plurality of cells in this preferred arrangement. In the sense of the present invention, integration of the length sensor at the edge of the module can preferably be understood as meaning a configuration of the wall of the housing surrounding the cells as a length sensor at least in sections.

The length sensor advantageously measures the length change of the galvanic element, that is to say the increase in the electrode thickness, directly or indirectly. An indirect measurement can be carried out, for example, using the torsion measurement of a spring plate arranged in the clearance between the end face and the housing surrounding the galvanic element, the measurement of the torsion, that is to say the force applied to the spring plate via the end face of the galvanic element as a result of the length expansion of the galvanic element, advantageously being converted into the change in the length of the galvanic element. The length expansion, that is to say the increase in the electrode thickness, is advantageously directly measured by sensing the position change of the end face of the battery cell or of the battery module relative to the housing surrounding the battery cell or the battery module. For example, a slide can be moved along a wire resistor with the end face on the wire resistor which is arranged on the housing. In this case, the length is advantageously measured in a resistance-based manner. It is also conceivable to move a ferrite core in a coil with length expansion of the galvanic element inside the coil. The length measurement carried out in this manner is advantageously carried out in an inductive manner in this case. The length measurement can also be advantageously directly measured optically using the interferometric measuring method. In this case, information relating to the length expansion, that is to say the electrode thickness, of the battery cell can be obtained from the physical effect of the interference.

The interferometric measuring method as an optical method is suitable, in particular, for precision measurements of the length expansion of the battery cell, in particular for very small cells with slight expansions, and for the precise measurement of very small expansions during development. In this case, a converging lens may be arranged, for example, on the housing wall in the clearance above the end face of the battery cell, which lens guides light coming from the end face of the battery cell into a focal plane and causes it to interfere there. However, other types of interferometer are naturally also conceivable and can be used to capture the length expansion of the battery cell.

The direct or indirect measurement of the length change of the galvanic element by means of the length sensor can be carried out discretely or continuously. For a discrete measurement, it is possible to use, for example, contact switches for particular length expansions of the galvanic element or of the battery module, proximity signals being generated by the switches. For this purpose, proximity switches (tactile, capacitive or inductive), as are used in various embodiments in factory automation, can be installed at various positions inside the clearance. The positions of the switches may be selected, for example, at 50% of the length expansion planned over the lifetime of the battery cell or at 100% of the length expansion, for example. In this case, the switch signals generated by the switches are preferably directly converted by the battery management system into signals which provide information on the aging of the battery cell or of the battery module. In the simplest case, the length change of the galvanic element can be captured using only one proximity switch or sensor. Inductance-based proximity switches or sensors are particularly preferably used as length sensors to measure the length change of the galvanic element.

The length sensor is advantageously in the form of a force sensor; in particular, the force sensor is a strain sensor, advantageously a strain gage, which can be operatively connected to a spring element which can be arranged in the clearance between the end face of the galvanic element and the housing in such a manner that, in the event of a length change of the galvanic element which causes deformation of the spring element, the deformation of the spring element can be sensed. If the spring element is in the form of a bent spring leaf, the strain gage can be directly applied to the spring element.

In order to avoid the arrangement of an additional spring element which occupies space, the housing wall of the galvanic element can be advantageously used as a length sensor in the form of the spring element. In particular, typical metal housings (prismatic hard case cells) can be advantageously in the form of an implicit spring element.

If, for example, the housing wall of the galvanic element or of the battery module is used as the spring element, the strain gage can be applied to the outside of the cell housing, that is to say to the housing wall, in order to detect a length change of the galvanic element. In this case, the force sensor in the form of a strain gage can be advantageously directly applied to the housing wall of the housing of the cell or of the cell module.

If the bending of the housing wall or of the spring leaf changes in the event of a length expansion of the galvanic element or of the battery module, the stretching of the strain gage operatively connected to spring element is advantageously changed. That is to say, if force is applied to the bent spring leaf or spring plate or to the housing wall in the form of a spring element via the end face of the galvanic element in the event of length expansion of the latter, the force sensor or the strain gage is stretched or compressed with the spring plate or the housing wall, the deformation of the spring element measured via the force sensor in the form of a strain gage advantageously being able to be converted into the length change of the galvanic element. That is to say, a force is applied to the force sensor as a result of the deformation of the spring element, the application of force being able to be measured, for example, as a change in the electrical resistance of the force sensor, the change in the electrical resistance, in particular, being able to be passed to a battery management system for the battery cell in the form of an electrical signal and being able to be advantageously evaluated there. In this case, the battery management system can preferably convert the stretching or the compression of the spring element into a length expansion of the module using a known spring constant of the spring element.

In order to capture the position change of the end face of the galvanic element relative to the housing surrounding the galvanic element or the length change of a module in a clearance at the edge of a plurality of battery cells by making electrical contact, in particular in a resistance-based, inductive and/or optical manner, the length sensor is advantageously in the form of a length measuring system having at least one length measuring element. In this case, the length measuring element records the position change of the end face of the galvanic element relative to the housing surrounding the galvanic element if the length of the galvanic element changes. A length measuring element operating in a resistance-based, inductive and/or optical manner may be—as already described above—a movable ferrite core in a coil (inductive), a slide on a wire resistor (resistance-based) or a converging lens for optical recording in the interferometric measuring method.

As the contact element, which is a contact or proximity switch for example, it is possible to make contact via the end face of the galvanic element in the event of length changes of the galvanic element, a signal generated by the contact element when contact is made, in particular, being able to be passed to the battery management system. The signal can be advantageously evaluated by the battery management system and can be converted into an optical and/or acoustic signal. The optical and/or acoustic signal may be, for example, in the form of a warning signal which indicates, for example, that the planned length expansion is 50% over the lifetime or 100%. However, the signal may also be stored in an error memory which can be read by a diagnostic device in order to therefore provide the information relating to the aging state of the battery cell.

Overall, with respect to the apparatus according to the invention, it can be summarized as advantageous that the aging behavior of a battery cell or of a battery module can be indirectly measured using the thickness expansion.

In this case, the expansion ref(q), where q is the charge throughput, can be advantageously compared with the current expansion act(q) using reference values, preferably on the basis of characteristic curves or families of characteristics, for example a reference curve. If a tolerance range or a tolerance value is exceeded in the comparison, for example if a tolerance band is left, a warning message can be advantageously given first of all. An error message can be advantageously given, preferably by a battery management system (BMS), only if a second, larger tolerance band is left or if a tolerance range or a tolerance value is significantly exceeded. In addition, it is possible to warn of a deviation from a regular aging process of the battery cell or of the battery module by means of the direct measurement using the apparatus according to the invention, in which case the warning can then be advantageously used, for example, to preventively exchange the module or battery cell in a workshop.

Warning or error messages can also be activated if particular aging values (=expansion values) are reached. This enables preventive service measures or else an estimation of the remaining service life of the battery.

However, as a result of the direct measurement of the length expansion of the galvanic element, that is to say of the battery cell or of the battery module, the operating strategy of the battery can also be advantageously alternatively adapted in order to reduce the aging of the battery cells or of the battery module. This can be carried out, for example, by reducing the charging currents or, overall, by adapting the charging and discharging strategy of the battery cell or of the battery module.

With respect to the advantages of the battery cell according to the invention having at least one galvanic element for converting chemical energy into electrical energy, which battery cell comprises an apparatus according to the invention, reference is made to the description of the advantageous configuration of the apparatus according to the invention in order to avoid repetitions and that description is fully incorporated by reference.

The battery cell module according to the invention for providing electrical energy, having at least two battery cells, in particular having at least one battery cell according to the invention, each of the battery cells having at least one galvanic element for converting chemical energy into electrical energy, and the battery cells having a common housing which surrounds the galvanic elements and has a wall, and at least one battery cell having an apparatus according to the invention, provides for the apparatus to be able to be arranged in a clearance, the clearance being formed between at least one of the end faces of one of the battery cells and the wall of the housing surrounding the battery cells. If a plurality of battery cells are connected to one another, for example, for the purpose of increasing the capacitance in order to form a battery cell module, the apparatus according to the invention is also intended to be able to determine the aging of the battery cell module having a plurality of battery cells via the length expansion of at least one galvanic element of a battery cell. The battery cells, that is to say the galvanic elements, may be arranged in this case in a manner stacked inside a module housing to form a cell stack. The apparatus according to the invention can be advantageously arranged between a pressure plate, which may be the end face of a galvanic element, and the module housing. In order to avoid repetitions here with regard to further advantages of the battery cell module according to the invention, reference is made to the description of the advantages of the apparatus according to the invention and that description is fully incorporated by reference.

The proposed method according to the invention for monitoring the length change of a galvanic element of a battery cell, in particular for monitoring the length change of a battery cell according to the invention, or of a galvanic element of at least one battery cell in a battery cell module, in particular in the battery cell module according to the invention, advantageously has the following steps of:

directly measuring or indirectly measuring the length change of the galvanic element with the apparatus according to the invention, converting the measurement data obtained during the measurement of the length change into electrical signals, forwarding the electrical signals to a battery management system, correcting the measured values converted via the electrical signals by capturing a state of charge of the battery cell, determining the aging of the battery cell on the basis of the corrected measured values, in particular on the basis of the measured values which have been converted into electrical signals and have been corrected.

If a deviation from a regular aging process of the battery cell or of the battery module is determined using the method according to the invention, the regular aging process of the battery cell or of the battery module being stored and parameterized in the battery management system as reference values, for example, the following measures can be optionally initiated via the battery management system, for example, in the event of a deviation from a regular aging process of the battery cell or of the battery module:

outputting a warning signal, and/or adapting the operating strategy of the battery cell or of the battery module in order to influence the aging process of the battery cell or of the battery module, replacing the battery cell or the battery module in a workshop, for example.

In one advantageous development of the method, the measured length change of the galvanic element of the battery cell is compared with reference length changes for the galvanic element of the battery cell. In this case, the values for the reference length changes advantageously take into account the respective state of charge of the battery cell or of the battery module. If the values for the length expansion of the battery cell or of the battery module, which are determined using the apparatus according to the invention and are corrected based on the state of charge of the battery cell or of the battery module, differ from the stored reference length changes, a signal, and in particular a warning signal here, is advantageously generated and, for example, acoustically and/or optically warns of severe aging of the galvanic element as a result of extreme Li plating, for example. In order to also avoid repetitions here with respect to further advantages of the method according to the invention, reference is made to the description of the advantageous configuration of the apparatus according to the invention and that description is fully incorporated by reference.

BRIEF DESCRIPTION OF THE DRAWINGS

Further measures which improve the invention emerge from the following descriptions of exemplary embodiments of the invention which are schematically illustrated in the figures. All features and/or advantages, including design details, spatial arrangements and method steps, which emerge from the claims, the description or the drawings can be essential to the invention both per se and in a wide variety of possible combinations. In this case, it should be noted that the figures have only a descriptive character and are not intended to restrict the invention in any way.

In the drawings:

FIG. 1 shows a schematic sectional view of an exemplary embodiment of an apparatus according to the invention having a length sensor which is operatively connected to a spring element inside a battery module, FIG. 2 shows another exemplary embodiment of an apparatus according to the invention having a length sensors which are in the form of contact elements.

DETAILED DESCRIPTION

Figure 3:
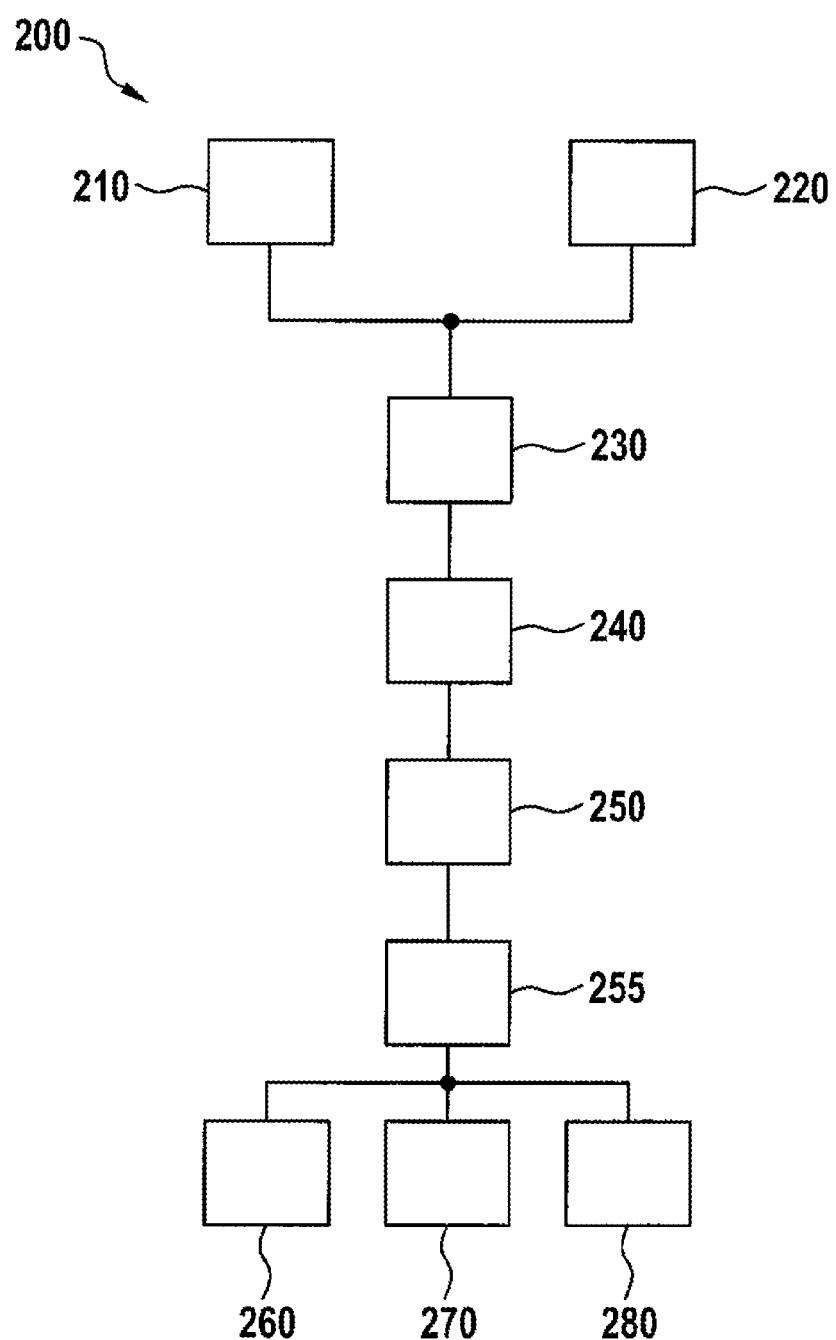
FIG. 3 shows a tree diagram illustrating the method steps of the method according to the invention.

In the different figures, identical technical features are always provided with the same reference symbols, which is why they are generally described only once.

FIG. 1 shows a plurality of battery cells 2 which are connected in series, each have a galvanic element 3 and are surrounded by a common housing 4. The housing 4 is a housing 4 of a battery cell module 100 which comprises, inter alia, the battery cells 2 connected to one another. The galvanic elements 3 of the battery cells 2 are used to convert chemical energy into electrical energy. Depending on the state of charge and aging state of the battery cells 2, the result is a length expansion of the galvanic element 3 in the positive or negative x-axis direction. The length expansion may arise both as a result of the formation of gas and as a result of an increase in the electrode thickness of the battery cells 2. A clearance 6 is respectively formed on both sides of the outer battery cells 2 in each case and between the wall 8 of the housing 4 surrounding the galvanic elements 3 on both sides of the cell group or cell stack formed by the battery cells 2, the clearances 6 being used to enable the length expansion, which changes with respect to different states of charge, or the length expansion, caused by aging of the battery cells 2, of the galvanic elements 3 inside the housing 4 of the battery module 100. In order to ensure a defined position of the cell stack in the housing and to fix it in a resilient manner, an end plate 10 in the form of a spring is provided. For example, a length sensor 5 is arranged on a spring element 10, in the form of a leaf spring, only in FIG. 1 in the left-hand clearance 6 and senses the length change of the galvanic element(s) 3 of the battery module 100. The length sensor 5 can be used to determine the aging of the battery cell 2 and of the battery module 100 in the present case using the length change of the galvanic elements 3 of the battery cells 2. The length sensor 5 illustrated in FIG. 1 is in the form of a strain gage or force sensor 9 which is operatively connected to a spring element 10 arranged in the clearance 6 between the end face 7 and the wall 8. If length expansion of the galvanic element 3 of the battery cells 2 occurs, the spring element 10 in the form of a bent spring plate is bent or pressed in the direction of the wall 8 of the housing 4 of the battery module 100 as a result of displacement of the end face 7. The force sensor 9 in the form of a strain gage is operatively connected to the spring element 10 in the form of a bent spring plate in such a manner that the stretching of the strain gage also changes during bending, that is to say pressing, of the spring element 10, so that the force sensor 9 functions as a length sensor 5. If the cell stack expands, the spring element 10 is flattened, that is to say the strain gage which is adhesively bonded to the spring element 10 on the side of the cell stack is released, that is to say contracts. This change is then read. That is to say, the spring element 10 converts the change in distance which is measured as the change in the electrical resistance of the force sensor 9, here of the strain gage in particular. In this respect, the measurement of the length changes of the apparatus 1 illustrated in FIG. 1 is effected indirectly by converting the change in distance caused by the spring element 10 during the length expansion of the battery cell 2. The spring element 10 may also be additionally equipped with a sensor 5, for example in the right-hand clearance 6. In the case of low-friction mounting of the cell stack in the housing, one sensor may suffice on account of the action=reaction, contrary to the illustration in FIG. 1, but two sensors 5 are advantageous in the case of strong friction. In this respect, if only one sensor is assumed, contrary to the illustration in FIG. 1, only the configuration of the left-hand pressure plate illustrated in FIG. 1 is conceivable, with the result that the cell stack can expand only to the left.

As illustrated in FIG. 1, the change in the electrical resistance is passed to a management system 50, namely to a battery management system 50 for the battery cell 2, in the form of an electrical signal and can be evaluated, for example, by means of reference length changes which are stored and parameterized as values in the battery management system 50. If the battery management system 50 detects aging of the battery cells 2 of the battery module 100 far above average, which is caused by extreme Li plating for example, the battery management system 50 can directly convert the diagnosed extreme aging into warning signals. If aging of the battery cell 2 or of the battery module 100 which is advancing too rapidly is diagnosed on the basis of the measured values with the reference values stored in the battery management system 50, the operating strategy 270 of the battery cell 2, for example, can be adapted via the battery management system 50 in order to influence the aging process of the battery cell 2 or of the battery module 100. For example, replacement 280 of the battery cell 2 or of the battery module 100 can also be arranged via the battery management system 50.

FIG. 2 shows the battery module 100 from FIG. 1, but the force sensor 9 in the form of a length sensor 5 in FIG. 1 and the spring element 10 (in the left-hand clearance 6) have been replaced with contact elements 11 which are arranged on the wall 8 and are in the form of proximity switches.

The contact elements 11 together form the length sensor 5 of the apparatus 1 according to the invention. In this case, the contact elements 11 are configured in such a manner that they measure different length expansions of the battery cells 2, in particular of the galvanic elements 3, of the battery module 100. For this purpose, in the embodiment shown, the contact elements 11 in the form of proximity switches have switching lugs 12 of different lengths which are advantageously pressed in a telescopic manner into the contact elements 11 in the direction of the wall 8 via the end face 7 in the event of length expansion of the battery cells 2. In this case, the lower contact element 11 illustrated in FIG. 2 has a longer switching lug 12 than the uppermost contact element 11 of the apparatus 1. Accordingly, the lower contact element 11, for example, can indicate, by virtue of the switching lug 12 retracting into the contact element 11, an aging state of the battery cells 2 of the battery module of 50% of the length expansion planned over the lifetime, the central contact element 11 can indicate 75% and the upper contact element 11 can indicate 100% of the length expansion planned over the lifetime, for example. The signals generated via the contact elements 11 by the pressing-in of the switching lugs 12 are forwarded to a battery management system 50 and are processed by the latter, as described for the apparatus in FIG. 1.

FIG. 3 shows a schematic outline of the method 200 according to the invention in a tree diagram. The method 200 is used to monitor the length change of a galvanic element 3 of a battery cell 2, in particular of a battery cell 2 according to the invention or of a galvanic element 3 of at least one battery cell 2 in a battery cell module 100, in particular in a battery cell module 100 according to the invention. In this case, the method 200 is carried out according to the following steps: the length change of the galvanic element 3 of the battery cell 2 or of a battery cell module 100, the length expansion of the battery cells 2 and, here in particular, of the galvanic elements 3 of the battery cells 2 also being measured in the battery cell module 100, is effected via a direct measurement 210 or an indirect measurement 220 using the apparatus 1 according to the invention. The direct measurement 210 can be carried out, for example, in a resistance-based, inductive or optical manner, for example by means of interferometric light measurement, as illustrated for FIG. 2, for example. The indirect measurement 220 can be carried out, for example, using a force sensor 9 which is operatively connected to a spring plate in the form of a spring element 10 in such a manner that the torsional force, that is to say the compression or stretching of the spring element 10, is measured by means of the apparatus in the event of a length change, that is to say in the event of length expansion, of the galvanic element 3 and is converted into electrical signals and, here in particular, into a change in the resistance of the force sensor 9 which is preferably a strain gage (see FIG. 1, inter alia). The measurement data obtained during the indirect or direct length measurement 210 and 220 are converted into electrical signals in method step 230. In a further method step 240, the electrical signals are forwarded to a battery management system 50. In the battery management system 50, the measured values converted using the electrical signals are corrected 250 by capturing a state of charge of the battery cell 2 or of the battery cell module 100.

In a further method step 255, the aging of the battery cell 2 is determined on the basis of the corrected measured values, in particular on the basis of the corrected measured values which have been converted into electrical signals, by means of reference length changes stored in the battery management system 50. The reference length changes are advantageously parameterized, which means that the following measures are optionally initiated in further steps of the method:

Step 260: optical and/or acoustic output of a warning signal, adaptation of the operating strategy 270 of the battery cell 2 or of the battery module 100 in order to influence the aging process of the battery cell 2 or of the battery module 100, or step 280: replacement of the battery cell 2 or of the battery module 100, for example in a workshop.

The invention claimed is:

1. A battery cell module (100) for providing electrical energy, the battery cell module comprising
    at least first and second battery cells (2) having respective first and second galvanic elements (3) for converting chemical energy into electrical energy,
    wherein the battery cells (2) have a common housing (4) which surrounds the galvanic elements (3) and has a wall (8) formed at least on one side of the first galvanic element (3),
    wherein the first battery cell (2) has an apparatus (1) for determining the aging of the first battery cell (2), the apparatus (1) comprising at least one length sensor (5) for sensing a length change of the first galvanic element (3) and thereby determining the aging of the first battery cell (2),
    wherein the apparatus (1) is arranged in a clearance (6), the clearance (6) being formed between an end face (7) of the first battery cell (2) and the wall (8) of the housing (4) surrounding the battery cells (2), and/or
    wherein the apparatus (1) is formed at least in sections in the wall (8) of the common housing (4) surrounding the battery cells (2).

2. The battery cell module (100) according to claim 1, characterized in that the length sensor (5) is arranged in a clearance (6) between the galvanic element (3) and the housing (4) surrounding the galvanic element (3).

3. The battery cell module (100) according to claim 1, the wall (8) of the housing (4) surrounding the galvanic element (3) being in the form of the length sensor (5) at least in sections, the wall (8) being able to be deformed in such a manner that the length change of the galvanic element (3) can be sensed via the deformation of the wall.

4. The battery cell module (100) according to claim 1, characterized in that the length sensor (5) measures the length change of the galvanic element (3) directly or indirectly.

5. The battery cell module (100) according to claim 1, characterized in that the length sensor (5) measures the length change discretely or continuously.

6. The battery cell module (100) according to claim 1, characterized in that the length sensor (5) is a force sensor (9) which can be operatively connected to a spring element (10) which can be arranged in the clearance (6) between the end face (7) of the galvanic element (3) and the housing (4) in such a manner that, in the event of a length change of the galvanic element (3) which causes deformation of the spring element (10), the deformation of the spring element (3) can be sensed.

7. The battery cell module (100) according to claim 6, characterized in that the measured deformation of the spring element (10) can be converted into the length change of the galvanic element (3), as a result of the deformation of the spring element (10), the application of force being able to be measured as a change in the electrical resistance of the force sensor (9).

8. The battery cell module (100) according to claim 1, characterized in that the length sensor (5) is in the form of a length measuring system having at least one length measuring element, the length measuring element recording the length change of the end face (7) of the galvanic element (3) relative to the housing (4) surrounding the galvanic element (3) if the length of the galvanic element (3) changes by making electrical contact.

9. The battery cell module (100) according to claim 1, characterized in that the length sensor (5) is in the form of at least one contact element (11), contact being able to be made with the contact element (11) via the end face (7) of the galvanic element (3) if the length of the galvanic element (3) changes.

10. The battery cell module (100) according to claim 1, characterized in that the length sensor (5) is arranged in a clearance (6) between the galvanic element (3) and the housing (4) surrounding the galvanic element (3), the clearance (6) being formed between at least one end face (7) of the galvanic element (3) and the wall (8) of the housing (4) surrounding the galvanic element (3), and/or the wall (8) of the housing (4) surrounding the galvanic element (3) being in the form of a length sensor (5) at least in sections, the wall (8) being able to be deformed in such a manner that the length change of the galvanic element (3) can be sensed via the deformation of the wall.

11. The battery cell module (100) according to claim 1, characterized in that the length sensor (5) measures the length change of the galvanic element (3) directly, as a length change, or indirectly, as a curvature change.

12. The battery cell module (100) according to claim 1, characterized in that the length sensor (5) is a strain gage which can be operatively connected to a spring element (10) which can be arranged in the clearance (6) between the end face (7) of the galvanic element (3) and the housing (4) in such a manner that, in the event of a length change of the galvanic element (3) which causes deformation of the spring element (10), the deformation of the spring element (3) can be sensed.

13. The battery cell module (100) according to claim 12, characterized in that the measured deformation of the spring element (10) can be converted into the length change of the galvanic element (3), as a result of the deformation of the spring element (10), the application of force being able to be measured as a change in the electrical resistance of the force sensor (9), the change in the electrical resistance being passed to a management system (50) for the battery cell (2) in the form of an electrical signal, and the signal being evaluated by the management system (50).

14. The battery cell module (100) according to claim 1, characterized in that the length sensor (5) is in the form of a length measuring system having at least one length measuring element, the length measuring element recording the length change of the end face (7) of the galvanic element (3) relative to the housing (4) surrounding the galvanic element (3) if the length of the galvanic element (3) changes by making electrical contact, in a resistance-based, inductive and/or optical manner.

15. The battery cell module (100) according to claim 1, characterized in that the length sensor (5) is in the form of a proximity switch, contact being able to be made with the contact element (11) via the end face (7) of the galvanic element (3) if the length of the galvanic element (3) changes, a signal generated by the contact element (11) when contact is made being passed to the management system (50) for the battery cell (2), and the signal being evaluated by the management system (50) and/or being converted into an optical and/or acoustic signal.

16. A method (200) for monitoring the length change of a galvanic element (3) of a battery cell (2), the method (200) comprising the steps of:
   directly measuring (210) or indirectly measuring (220) the length change of the galvanic element (3) with an apparatus (1) according to claim 1,
   converting (230) the measurement data obtained during the measurement of the length change into electrical signals,
   forwarding (240) the electrical signals to a battery management system (50),
   correcting (250) the measured values converted via the electrical signals by capturing a state of charge of the battery cell, and
   determining the aging (255) of the battery cell (2) on the basis of the corrected measured values.

17. The method according to claim 16 wherein the aging of the battery cell is determined on the basis of the measured values which have been converted into electrical signals and have been corrected, by means of reference length changes.

18. The method according to claim 16, wherein the measured length change of the galvanic element (3) of the battery cell (2) is compared with reference length changes for the galvanic element (3) of the battery cell (2).

19. A battery cell module (100) for providing electrical energy, the battery cell module comprising
   at least first and second battery cells (2) having respective first and second galvanic elements (3) for converting chemical energy into electrical energy,
   wherein the battery cells (2) have a common housing (4) which surrounds the galvanic elements (3) and has a wall (8) formed at least on one side of the first galvanic element (3), wherein the first battery cell (2) has an apparatus (1) for determining the aging of the first battery cell (2), the apparatus (1) comprising at least one length sensor (5) for sensing a length change of the first galvanic element (3) and thereby determining the aging of the first battery cell (2), and wherein the apparatus (1) is arranged in a clearance (6), the clearance (6) being formed between an end face (7) of the first battery cell (2) and the wall (8) of the housing (4) surrounding the battery cells (2).

20. The battery cell module (100) according to claim 19, wherein the apparatus (1) is formed at least in sections in the wall (8) of the common housing (4) surrounding the battery cells (2).

21. A battery cell module (100) for providing electrical energy, the battery cell module comprising at least first and second battery cells (2) having respective first and second galvanic elements (3) for converting chemical energy into electrical energy, wherein the battery cells (2) have a common housing (4) which surrounds the galvanic elements (3) and has a wall (8) formed at least on one side of the first galvanic element (3), wherein the first battery cell (2) has an apparatus (1) for determining the aging of the first battery cell (2), the apparatus (1) comprising at least one length sensor (5) for sensing a length change of the first galvanic element (3) and thereby determining the aging of the first battery cell (2), and wherein the apparatus (1) is formed at least in sections in the wall (8) of the common housing (4) surrounding the battery cells (2).

\* \* \* \* \*